United States Patent
Wang et al.

(10) Patent No.: US 10,444,579 B2
(45) Date of Patent: Oct. 15, 2019

(54) DISPLAY SUBSTRATE AND MANUFACTURING METHOD THEREOF, AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xiaoyuan Wang, Beijing (CN); Yan Fang, Beijing (CN); Kui Zhang, Beijing (CN); Zhicai Xu, Beijing (CN); Ming Deng, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/767,883

(22) PCT Filed: Sep. 29, 2017

(86) PCT No.: PCT/CN2017/104432
§ 371 (c)(1),
(2) Date: Apr. 12, 2018

(87) PCT Pub. No.: WO2018/161549
PCT Pub. Date: Sep. 13, 2018

(65) Prior Publication Data
US 2019/0094598 A1 Mar. 28, 2019

(30) Foreign Application Priority Data

Mar. 10, 2017 (CN) .......................... 2017 1 0142159

(51) Int. Cl.
*G02F 1/1345* (2006.01)
*H01L 27/12* (2006.01)
(Continued)

(52) U.S. Cl.
CPC ...... *G02F 1/13458* (2013.01); *G02F 1/13452* (2013.01); *G02F 1/133345* (2013.01);
(Continued)

(58) Field of Classification Search
None
See application file for complete search history.

(56) References Cited

U.S. PATENT DOCUMENTS

2011/0156995 A1 6/2011 Choi et al.
2011/0157681 A1 6/2011 Kwon et al.
(Continued)

FOREIGN PATENT DOCUMENTS

CN 1832149 A 9/2006
CN 102141710 A 8/2011
(Continued)

OTHER PUBLICATIONS

International Search Report and Written Opinion dated Dec. 27, 2017; PCT/CN2017/104432.
(Continued)

*Primary Examiner* — Whitney Moore

(57) ABSTRACT

A display substrate and a manufacturing method thereof, and a display device are provided. The manufacturing method of the display substrate includes: forming an insulation layer on a base substrate, the base substrate including a display area and a peripheral area; and forming a planarization film on the insulation layer; performing a patterning process to the planarization film to form a planarization layer with a first thickness in the display area, a planarization layer with a second thickness in the peripheral area, and a first via hole
(Continued)

in the planarization layer with the second thickness, the second thickness being less than the first thickness, and performing an etching process on the peripheral area to thin or remove the planarization layer is with the second thickness, and forming a second via hole corresponding to the first via hole in the insulation layer.

7 Claims, 5 Drawing Sheets

(51) Int. Cl.
*G02F 1/1333* (2006.01)
*G02F 1/1362* (2006.01)
*G02F 1/1368* (2006.01)

(52) U.S. Cl.
CPC ........ *H01L 27/124* (2013.01); *H01L 27/1214* (2013.01); *H01L 27/1248* (2013.01); *H01L 27/1259* (2013.01); *H01L 27/1288* (2013.01); *G02F 1/1368* (2013.01); *G02F 2001/133357* (2013.01); *G02F 2001/136222* (2013.01); *G02F 2001/136236* (2013.01)

(56) References Cited

U.S. PATENT DOCUMENTS

| | | |
|---|---|---|
| 2011/0183479 A1 | 7/2011 | Lim et al. |
| 2014/0175442 A1 | 6/2014 | Kwack et al. |
| 2015/0144977 A1 | 5/2015 | Odaka et al. |
| 2018/0151591 A1 | 5/2018 | Liu |

FOREIGN PATENT DOCUMENTS

| | | |
|---|---|---|
| CN | 102156372 A | 8/2011 |
| CN | 103901679 A | 7/2014 |
| CN | 105826330 A | 8/2016 |
| CN | 106876411 A | 6/2017 |
| JP | 2007-033786 A | 2/2007 |

OTHER PUBLICATIONS

The First Chinese Office Action dated Mar. 27, 2019; Appln. No. 201710142159.0.

DISPLAY SUBSTRATE AND MANUFACTURING METHOD THEREOF, AND DISPLAY DEVICE

CROSS-REFERENCE TO RELATED APPLICATIONS

The application claims priority to the Chinese patent application No. 201710142159.0, filed on Mar. 10, 2017, the entire disclosure of which is incorporated herein by reference as part of the present application.

TECHNICAL FIELD

At least one embodiment of the present disclosure relates to a display substrate and a manufacturing method thereof, and a display device.

BACKGROUND

In thin-film-transistor liquid crystal display (TFT-LCD) products, a planarization (PLN) layer is often used to flatten films and reduce load. For example, the PLN layer includes an organic layer (ORG).

SUMMARY

At least one embodiment of the present disclosure relates to a display substrate, a manufacturing method thereof, and a display device, which are advantageous in reducing the thickness of a planarization layer in a peripheral area or removing a planarization layer in a peripheral area, facilitating connection of the first conductive unit and the second conductive unit, facilitating connection of the second conductive unit and the driving circuit, and obtaining a large contact area, a small contact resistance, and a good connectivity.

At least one embodiment of the present disclosure provides a manufacturing method of a display substrate, comprising:

forming an insulation layer on a base substrate, the base substrate comprising a display area and a peripheral area;

forming a planarization film on the insulation layer;

performing a patterning process to the planarization film to form a planarization layer with a first thickness in the display area, a planarization layer with a second thickness in the peripheral area, and a first via hole in the planarization layer with the second thickness, the second thickness being less than the first thickness;

performing an etching process on the peripheral area to thin or remove the planarization layer with the second thickness, and forming a second via hole corresponding to the first via hole in the insulation layer.

At least one embodiment of the present disclosure further provides a display substrate, comprising:

a base substrate, comprising a display area and a peripheral area;

an insulation layer, located on the base substrate;

a planarization layer, located on the insulation layer, and the planarization layer comprising a display-area planarization layer in a display area and a peripheral-area planarization layer in a peripheral area; wherein a thickness of the peripheral-area planarization layer is less than that of the display-area planarization layer, and a via hole passing through the peripheral-area planarization layer and the insulation layer is provided in the peripheral area.

At least one embodiment of the present disclosure further provides a display substrate, comprising:

a base substrate, comprising a display area and a peripheral area;

a gate insulation layer, located on the base substrate;

a passivation layer, located on the gate insulation layer, the passivation layer comprising a passivation layer with a first thickness located in the display area and a passivation layer with a second thickness located in the peripheral area, wherein the second thickness is less than the first thickness, a via hole is provided in the gate insulation layer and the passivation layer with the second thickness, or is provided in the passivation layer with the second thickness.

At least one embodiment of the present disclosure further provides a display device including the display substrate provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a color filter on array (COA) product, an ORG layer is used to flatten color photoresist step difference of sub-pixels (for example, RGB), and the ORG layer is located above the RGB color photoresist. In addition, the ORG layer is often adopted to reduce the load in low-power, small-sized mobile products, thereby reducing power consumption.

Figure 1:
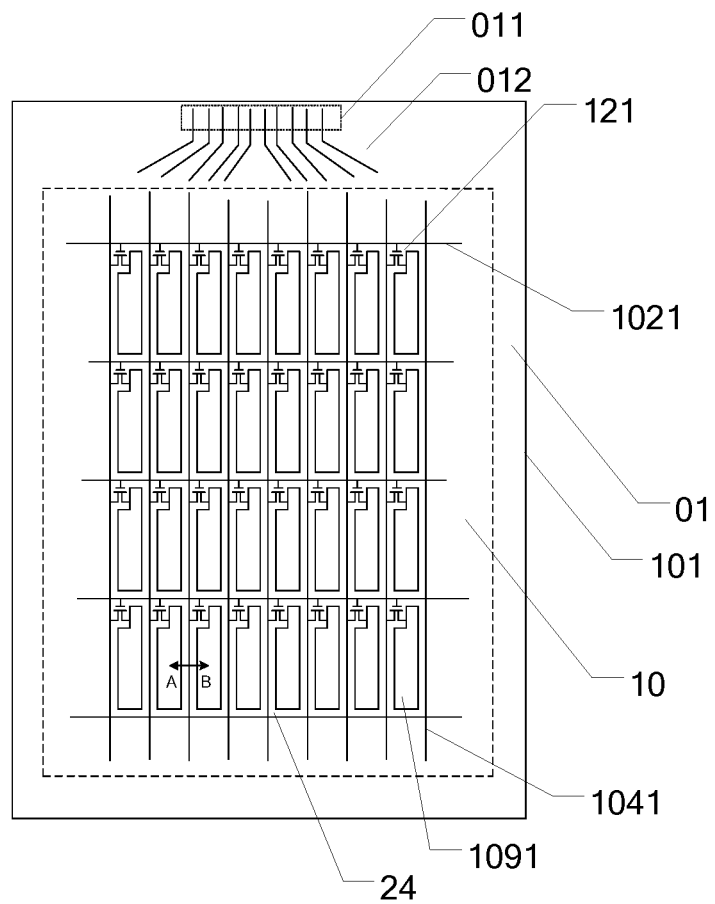
FIG. 1 is a top view of a display substrate.

An array substrate of a COA liquid crystal display panel is taken as an example. As illustrated in FIG. 1, the array substrate includes a base substrate 101, and the base substrate 101 includes a display area 10 and a peripheral area 01. As illustrated in FIG. 1, a plurality of gate lines 1021 and a plurality of data lines 1041 are further provided on the base substrate 101. For example, the plurality of gate lines 1021 and the plurality of data lines 1041 are insulated from each other, and the plurality of gate lines 1021 are intersected with the plurality of data lines 1041 to define a plurality of sub-pixel units 24.

For example, the peripheral area 01 is provided on at least one side of the display area 10. For example, the peripheral area 01 is provided around the display area 10. For example, the display area 10 is located in the middle of the display substrate. For example, the display area 10 includes a plurality of sub-pixel units arranged in an array, and each of the sub-pixel units includes a thin film transistor (TFT) 121 as a switching element. For example, the thin film transistor 121 includes a gate electrode, a gate insulation layer, an active layer, and source and drain electrodes.

Figure 2:
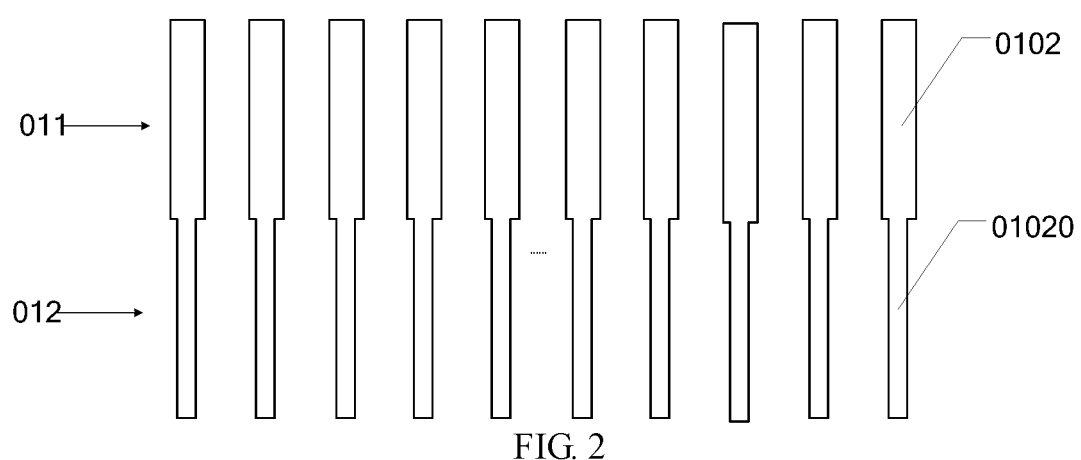
FIG. 2 is a schematic top view of wiring of a peripheral area of a display substrate.

As illustrated in FIG. 2, the peripheral area 01 includes a wiring area (pad area) 011 and a fan-out area 012. A first conductive unit 0102 in the wiring area 011 is electrically connected with the connection wire 01020 in the fan-out area 012. For example, the first conductive unit 0102 and the connection wire 01020 in the fan-out area 012 can be integrally formed, but is not limited thereto. The first conductive unit 0102 can be connected with an anisotropic conductive adhesive (not illustrated in the figure) through a via hole (not illustrated in the figure) through a second conductive unit (e.g., indium tin oxide (ITO) or metal, not illustrated in the figure), and then connected with a driving circuit (for example, chip on film (COF) or integrated circuit (IC), not illustrated in the figure). A signal of the driving circuit enters the display panel through the second conductive unit, the first conductive unit 0102, and the connection wire 01020 in the fan-out area 012 sequentially, so as to realize signal inputting (referring to FIG. 9F).

Figure 3:
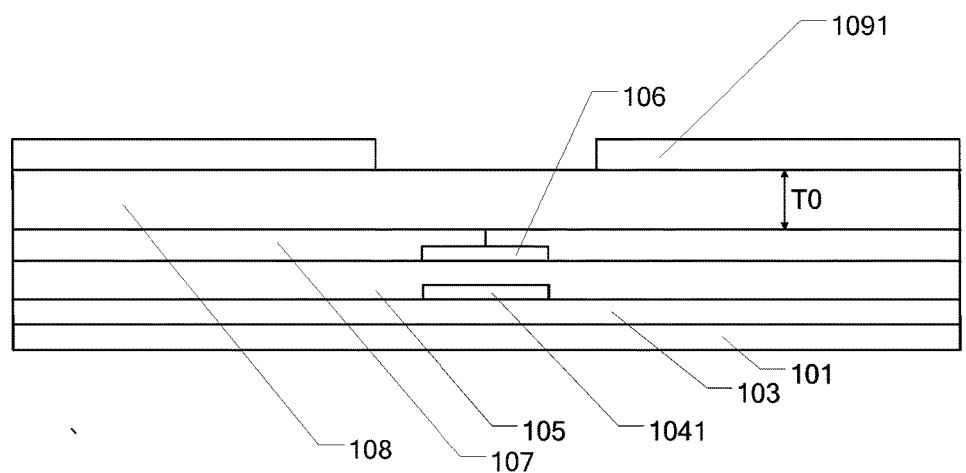
FIG. 3 is a schematic sectional view of FIG. 1 taken along line A-B.

As illustrated in FIG. 3, in the display area 10, the display substrate includes the base substrate 101 and a gate insulation layer (GI) 103, a data line 1041, and a passivation (PVX) layer, a black matrix 106, a color filter layer 107, a planarization layer 108 with a first thickness, and a pixel electrode 1091 sequentially disposed on the base substrate 101. The pixel electrode 1091 can be electrically connected with the drain electrode of the TFT. The first thickness of the planarization layer 108 in the display area 10 is T0. In the embodiment of the present disclosure, for example, thickness refers to a height of a layer/film in a direction perpendicular to the base substrate.

Figure 4:
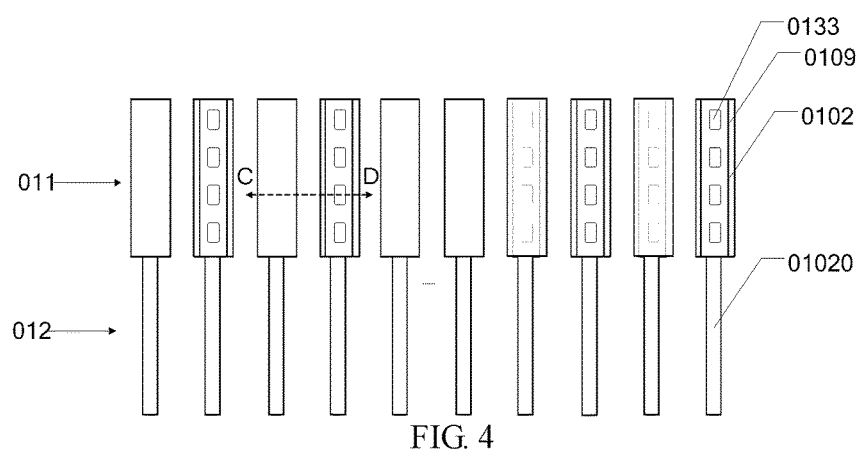
FIG. 4 is a schematic top view of a peripheral area of a display substrate.
Figure 5:
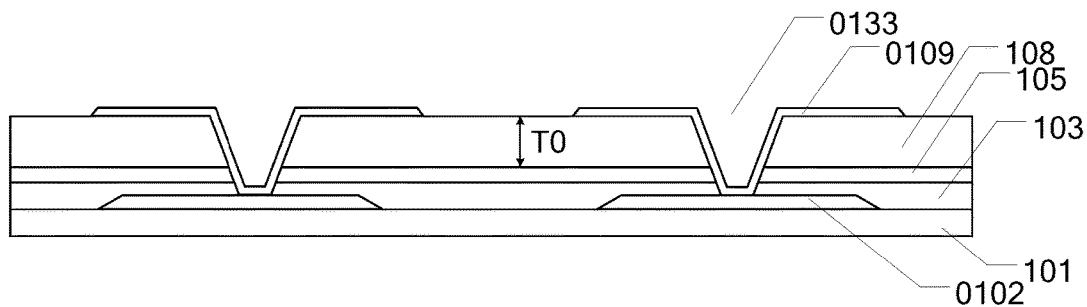
FIG. 5 is a schematic cross-sectional view of FIG. 4 taken along line C-D.

FIG. 4 illustrates that in the peripheral area, the second conductive unit 0109 is electrically connected with the first conductive unit 0102 through a planarization layer via hole 0133. As illustrated in FIG. 5, the planarization layer via hole 0133 passes through the gate insulation layer 103, the passivation layer 105, and the planarization layer 108 with the first thickness. The planarization layer 108 with the first thickness is a planarization layer of an initial thickness.

For products with a planarization layer, because the planarization layer is thick (generally larger than 2 µm), if wires in the wiring area 011 are connected with each other through the planarization layer via hole 0133, the via hole is large (generally with a diameter larger than 20 µm), as illustrated in FIG. 5. At the same time, the via hole has a large thickness, and a portion of the second conductive unit 0109 located in the via hole may not be in effective contact with the driving circuit. Thus, the contact area between the second conductive unit 0109 and the driving circuit is small, the contact resistance is large, and the connectivity is not good.

In a product with a planarization layer, in order to enhance the contact between the driving circuit and the second conductive unit 0109, the pad area 011 is usually designed in the following two ways.

Figure 6:
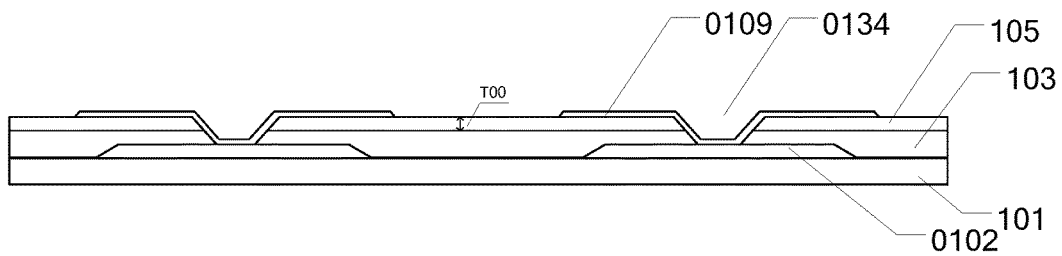
FIG. 6 is another schematic cross-sectional view of FIG. 4 taken along line C-D (a schematic diagram illustrating connection of a second conductive unit and a first conductive unit when a planarization layer with a second thickness is just completely removed during thinning according to an embodiment of the present disclosure.)

First, a passivation layer mask (PVX Mask) is used. After the planarization film is exposed and developed, the planarization film in the pad area is removed, a passivation layer mask is used to obtain a via hole in the pad area for wiring connection; and a part of the wire in the pad area 011 exposed by the passivation layer via hole 0134 is connected with the second conductive unit 0109; the passivation layer via hole 0134 passes through the passivation layer 105 and the gate insulation layer 103, as illustrated in FIGS. 4 and 6. This design can avoid the oxidative corrosion of the wire in the pad area 011, but it needs to add a PVX mask, the cost is increased, and the production capacity is affected at the same time.

Figure 7:
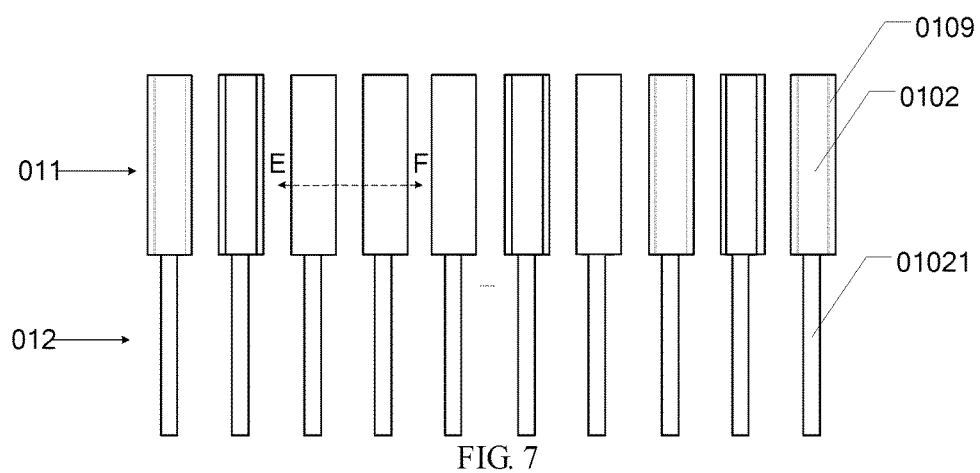
FIG. 7 is a schematic top view of a peripheral area of a display substrate.
Figure 8:
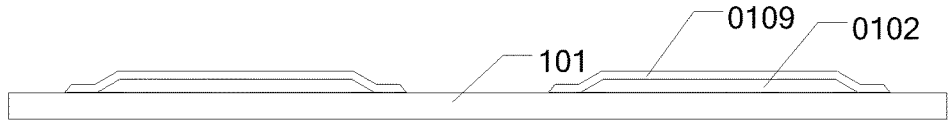
FIG. 8 is a schematic sectional view of FIG. 7 taken along line E-F.

Second, without using a PVX mask, after the planarization film is exposed and developed, the planarization film of the entire pad area is removed, and then the insulation layer (PVX/GI) is etched. The first conductive unit 0102 in the pad area is completely exposed, and then is directly connected with the second conductive unit 0109, as illustrated in FIGS. 7 and 8. Because there is no insulation layer to protect the first conductive unit in the pad area, the wires are easily oxidized and corroded in the environment, which affects the product yield and service life.

The pad area design of the product without the planarization layer can also be as illustrated in FIG. 6, and the first conductive unit 0102 is connected with the second conductive unit 0109 through the PVX via hole 0134. The second conductive unit 0109 generally completely covers a portion of the first conductive unit 0102 exposed by the via hole, and a part of the first conductive unit 0102 in the pad area corresponding to areas other than the via hole has GI and PVX insulation protection. The GI and PVX film thicknesses are generally in a level of thousand Angstroms (for example, the film thickness is 4000 Å). Because the insulation layer is thin, the via hole is small (generally with a diameter less than 10 μm), and at the same time, the via hole has a small thickness, and the second conductive unit 0109 in the via hole can also be in contact with the anisotropic conductive adhesive, so that the driving circuit can be almost in contact with the second conductive unit 0109 of the entire wiring area, the contact area is large, the resistance is small, and the connectivity is good.

At least one embodiment of the present disclosure provides a manufacturing method of a display substrate, comprising:

forming an insulation layer on a base substrate, the base substrate comprising a display area and a peripheral area;

forming a planarization film on the insulation layer;

performing a patterning process to the planarization film to form a planarization layer with a first thickness in the display area, a planarization layer with a second thickness in the peripheral area, and a first via hole in the planarization layer with the second thickness, the second thickness being less than the first thickness;

performing an etching process in the peripheral area so that the planarization layer with the second thickness is thinned or removed, and a second via hole corresponding to the first via hole is formed in the insulation layer.

At least one embodiment of the present disclosure provides a method for manufacturing a display substrate. When a planarization film is subjected to a patterning process, a planarization layer with a first thickness is formed in the display area, and simultaneously, a planarization layer with a second thickness is formed in the peripheral area. Thus, it is advantageous in reducing the thickness of the planarization layer in the peripheral area (for example, the pad area) or removing the planarization layer in the peripheral area (for example, the pad area), facilitating the connection of the first conductive unit and the second conductive unit, and facilitating the connection of the second conductive unit and the driving circuit, and obtaining large contact area, small contact resistance, and good connectivity.

First Embodiment

The present embodiment provides a method for manufacturing a display substrate, as illustrated in FIGS. 1, 9A-9E, including the following steps.

Figure 9A:
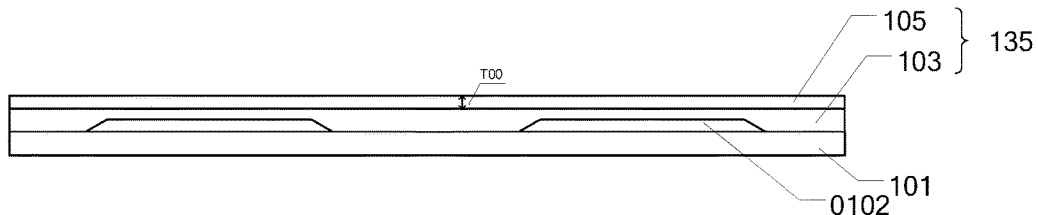
FIG. 9A is a schematic diagram of forming a first conductive unit, a gate insulation layer, and a passivation layer in a peripheral/pad area according to an embodiment of the present disclosure.

Step S1: as illustrated in FIGS. 1 and 9A, providing a base substrate 101. The base substrate 101 includes a display area 10 and a peripheral area 01. The peripheral area 01 includes a pad area 011. In this embodiment, the pad area 011 of the peripheral area 01 is described as an example. A first conductive unit 0102 is formed in the pad area 011 of the base substrate 101, an insulation layer 135 is formed on the first conductive unit 0102, and the insulation layer 135 includes a gate insulation layer 103 and a passivation layer 105, and the gate insulation layer 103 is closer to the base substrate 101 than the passivation layer 105.

Figure 9B:
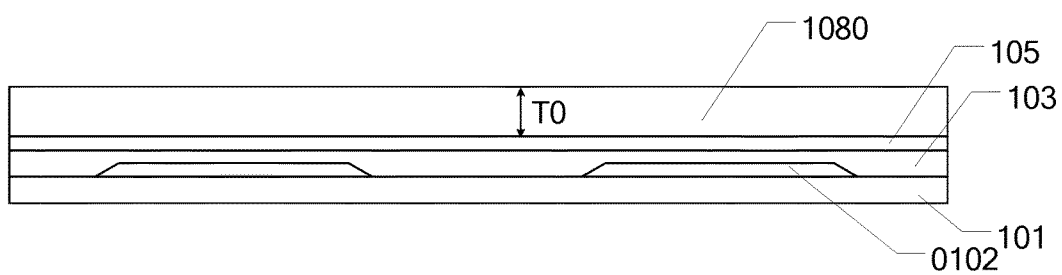
FIG. 9B is a schematic diagram of forming a planarization film in a peripheral/pad area according to an embodiment of the present disclosure.

Step S2: as illustrated in FIG. 9B, forming a planarization film 1080 on the insulation layer 135. A thickness of the planarization film 1080 is T0. A material of the planarization film 1080 includes, for example, an organic material. This embodiment is described by taking the material of the planarization film 1080 is an organic material as an example.

Figure 9C:
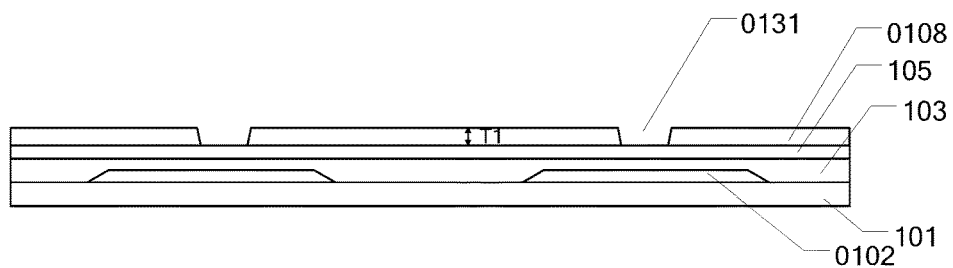
FIG. 9C is a schematic diagram of forming a planarization layer with a second thickness in a peripheral/pad area according to an embodiment of the present disclosure.

Step S3: as illustrated in FIG. 9C, performing a patterning process to the planarization film 1080 to form a planarization layer 108 with a first thickness in the display area 10 (referring to FIG. 3), a planarization layer 0108 with a second thickness in the peripheral area 01, and a first via hole 0131 in the planarization layer 0108 with the second thickness, and the second thickness T1 being less than the first thickness T0. For example, the first thickness is an initial thickness of the planarization film.

Figure 9D:
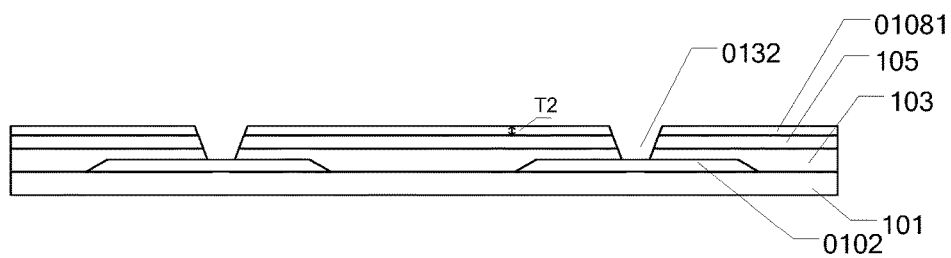
FIG. 9D is a schematic diagram of forming a second via hole in a gate insulation layer and a passivation layer at a position corresponding to a first via hole in a planarization layer with a second thickness in a peripheral/pad area according to an embodiment of the present disclosure.

Step S4: as illustrated in FIG. 9D, performing an etching process in the peripheral area 01 so that the planarization layer 0108 with the second thickness is thinned. A thickness of the thinned planarization layer 01081 is T2, and T2 is less than T1. And, a second via hole 0132 corresponding to the first via hole 0131 is formed in the insulation layer 135. Because the second via hole 0132 corresponds to the first via hole 0131 in position, the second via hole 0132 passes through the thinned planarization layer 01081 and the insulation layer 135.

Figure 9E:
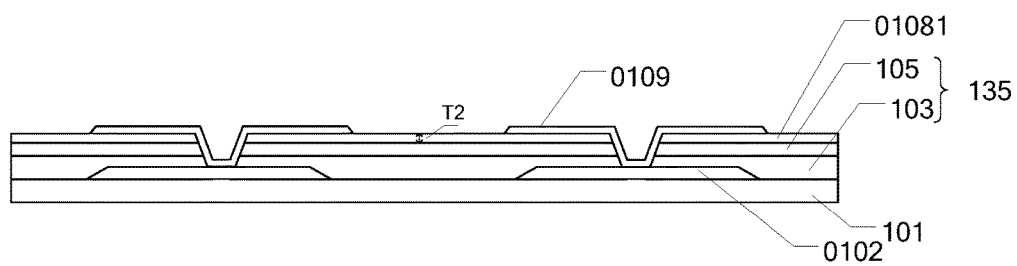
FIG. 9E is a schematic diagram of forming a second conductive unit in a peripheral/pad area according to an embodiment of the present disclosure.

Step S5: as illustrated in FIG. 9E, forming a second conductive unit 0109 in the peripheral area 01, and the second conductive unit being electrically connected with the first conductive unit 0102 through the second via hole 0132.

In the process of patterning the planarization film, a same one mask can be used; for example, a multi-tone mask is used to form a planarization layer with a first thickness in the display area and a planarization layer with a second thickness in the peripheral area. In comparison with the above-mentioned second general method for enhancing the contact between the driving circuit and the second conductive unit 0109, in the method provided by the present embodiment, a mask (PVX mask) can be omitted, the cost can be reduced, the production capacity can be improved, and the thickness of the planarization layer in the pad area is reduced, the connection of the first conductive unit 0102 and the second conductive unit 0109 is facilitated, the connection of the second conductive unit 0109 and the driving circuit 151 (as illustrated in FIG. 9F) is facilitated, the contact area is large, the contact resistance is small, and the connectivity is good, thereby facilitating the improvement of product yield and service life.

Figure 9F:
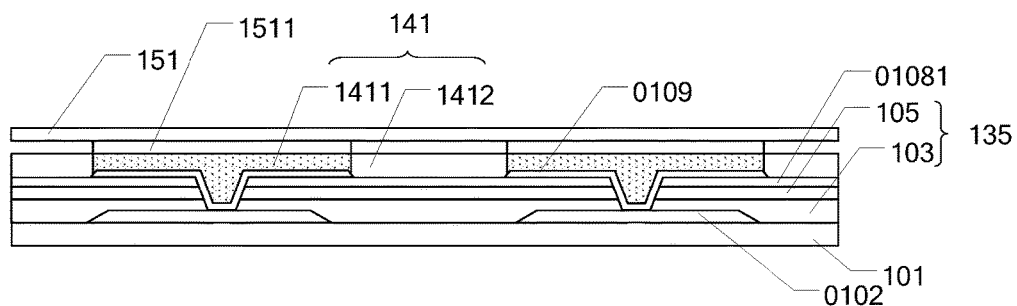
FIG. 9F is a schematic diagram of forming connection of the second conductive unit and the driving circuit in a peripheral/pad area according to an embodiment of the present disclosure.

An anisotropic conductive adhesive 141 is further illustrated in FIG. 9F. The anisotropic conductive adhesive 141 includes a conductive portion 1411 located between the connection electrode 1511 of the driving circuit 151 and the second conductive unit 0109, and a non-conductive portion 1412 located in the remaining area. The connection manner between the second conductive unit 0109 and the driving circuit 151 is not limited to that as illustrated in FIG. 9F. For example, the conductive portion 1411 is conductive in a direction perpendicular to the base substrate 101 but not conductive in a direction parallel with the base substrate 101, while the non-conductive portion 1412 is not conductive both in a direction perpendicular to the base substrate 101 and in a direction parallel with the base substrate 101.

In an example, the patterning process includes an exposure process and a development process. In order to save the number of masks, the planarization film can be exposed with a multi-tone mask.

For example, a multi-tone mask can include a halftone mask. A halftone mask can be used to expose the planarization film to simultaneously obtain a planarization layer with a first thickness and a planarization layer with a second thickness. In the halftone mask, a fully transparent area corresponds to the via holes (including a via hole in the display area and a via hole in the peripheral area), and a semitransparent area corresponds to other areas of the peripheral area except the via hole, an opaque area corresponds to other areas of the display area other than the via hole.

For example, after the planarization film is exposed and developed, a region corresponding to the fully transparent area forms a via hole, and a region corresponding to the semitransparent area forms a planarization layer with a second thickness (thinner planarization layer), and a region corresponding to the opaque area forms the planarization with the first thickness. Then, an etching is performed directly. In the peripheral area, the insulation layer under the first via hole in the planarization layer with the second thickness is etched, and the other area of the insulation layer is retained due to the protection of the planarization layer with the second thickness. This design can realize the formation of a relatively small planarization layer above the wires of the pad area, easy formation of small via holes in the pad area, and at the same time, effective protection of the wires in the pad area, can enhance the connectivity of the second conductive unit and the driving circuit, ensure product yield and service life while omitting a PVX mask. In an example, the etching process uses a dry etching process.

For example, in order to partially thin the planarization layer 0108 with the second thickness or remove the planarization layer 0108 with the second thickness in the etching process of step S4, the second thickness of the planarization layer 0108 is less than or equal to a thickness of the insulation layer 135.

For example, a material of the planarization film 1080 includes an organic material; and the organic material includes, for example, an acrylic resin or a polyimide resin, but the embodiment is not limited thereto.

For example, the first conductive unit 0102 can be made of metal or conductive metal oxide, and the second conductive unit 0109 can be made of metal or conductive metal oxide. For example, the conductive metal oxide includes indium tin oxide (ITO), but the embodiment is not limited thereto.

In an example, the first conductive unit 0102 in the peripheral area 01 can be disposed between the base substrate 101 and the gate insulation layer 103, and can be formed in the same layer with a gate electrode (not illustrated in the figure) or a gate line 1021 (referring to FIG. 1). In this case, the insulation layer 135 includes a gate insulation layer 103 and a passivation layer 105, and the gate insulation layer 103 is closer to the base substrate 101 than the passivation layer 105, as illustrated in FIG. 9E. For example, the gate electrode and the gate line 1021 can also be formed in the same layer. For example, the gate electrode and the gate line 1021 can be integrally formed.

Figure 12:
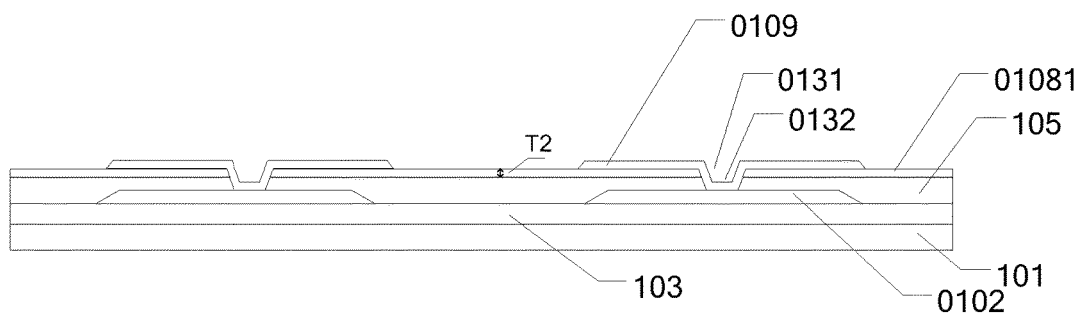
FIG. 12 is a schematic diagram of a second conductive unit connected with a first conductive unit through a second via hole when the first conductive unit is disposed between the gate insulation layer and the passivation layer according to an embodiment of the present disclosure.

In an example, the first conductive unit 0102 of the peripheral area 01 can be disposed between the gate insulation layer 103 and the passivation layer 105, and can be formed in the same layer with source and drain electrodes (not illustrated in the figure) or a data line 1041 (referring to FIG. 1 and FIG. 3). In this case, the insulation layer 135 includes a passivation layer 105 as illustrated in FIG. 12. For example, the source and drain electrodes and the data line 1041 can also be formed in the same layer.

In an example, before forming the planarization film 1080, a color filter layer 107 is further formed in the display area 10 (referring to FIG. 3).

In an example, a manufacturing method of the display substrate includes the following steps.

In step S11, forming a first conductive unit 0102 in the peripheral area 01/pad area 011 of the base substrate 101, and forming a gate electrode and a gate line 1021 in the display area 10.

For example, the first conductive unit 0102, the gate electrode, and the gate line 1021 can be formed in the same layer by film forming, exposing, developing, and etching.

Step S12: forming a gate insulation layer 103.

Step S13: forming an active layer (semiconductor layer), a source electrode and a drain electrode in the display area, while not providing active layer and source electrode and drain electrode in the peripheral/pad area.

Step S14: forming a passivation layer 105 (a protective layer, for example, can have a thickness of about 1000 Å).

Step S15: forming a color film layer (R/G/B film layer) in the display area, while not providing color film layer in the peripheral/pad area.

Step S16, forming a planarization film 1080 on the passivation layer 105, and the thickness of the planarization film 1080 being T0.

Step S17: exposing the planarization film 1080 with a halftone mask, and developing the planarization layer 108 to obtain a planarization layer 108 with a first thickness in the display area 10 and a planarization layer 0108 with the second thickness in the pad area 011.

By the exposure, a portion of the planarization film at the via holes in the display area and the peripheral area are all exposed, a portion of the planarization film in the r areas of the peripheral area other than the via hole are partially exposed, and a portion of the planarization in areas other than the via hole in the display area are not exposed.

After development, the planarization film at the via hole is completely removed to form the first via hole 0131, and a thinner planarization film (planarization layer 0108 with the second thickness) is formed at the semitransparent area, and the area not exposed forms the planarization layer 108 with the first thickness.

After the dry etching process, the passivation layer 105 and the gate insulation layer 103 of the pad area 011 under the first via hole 0131 are etched away, and the planarization layer 0108 with the second thickness is partially removed by dry etching to obtain a second via hole 0132. Finally, the formation of small via hole at the wire of the pad area is realized, which is similar to the effect of the pad area of a product that does not have a passivation layer.

Step S18: using the same patterning process, forming a second conductive unit 0109 in the peripheral/pad area, a pixel electrode 1091 in the display area; and the second conductive unit 0109 being electrically connected with the first conductive unit 0102 through the second via hole 0132, the pixel electrode 1091 being electrically connected with the drain electrode of the TFT through a via hole.

The above examples are described by taking a COA array substrate as an example, but the embodiment is not limited thereto.

Second Embodiment

Different from the first embodiment, in the manufacturing method of the display substrate provided in this embodiment, during the etching process in the peripheral area 01 in step S4, the planarization layer 0108 with the second thickness is just completely removed by thinning, and a second via hole 0132 corresponding to the first via hole 0131 is formed in the insulation layer 135, the second via hole 0132 passes through the insulation layer 135, and the second conductive unit 0109 is electrically connected with the first conductive unit 0102 through the second via hole 0132. The display substrate produced by the manufacturing method provided in this embodiment has the same effect as the pad area of a product without a planarization film.

Due to the dry etching process of the insulation layer, the planarization layer is damaged. Therefore, by adjusting the semi-transmissivity and the dry etching parameters, the planarization layer (corresponding to the semitransparent area of the mask) of the peripheral area can be completely removed without residue.

A cross-sectional view of the formed display substrate can be referred to FIG. 6.

Third Embodiment

Figure 10:
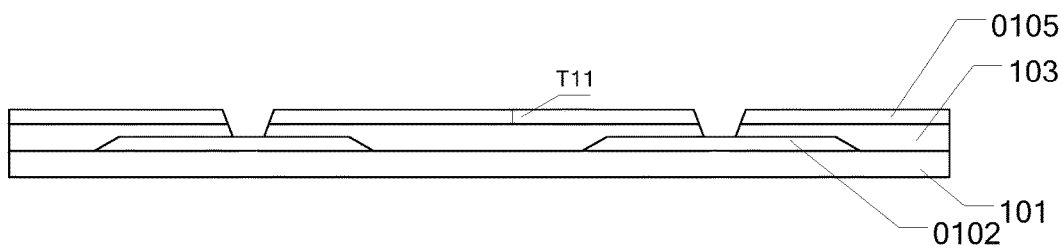
FIG. 10 is a schematic diagram of completely removing a planarization layer with a second thickness and etching a part of a passivation layer (an insulation layer) in thickness in an etching process of a peripheral/pad area according to an embodiment of the disclosure.
Figure 11:
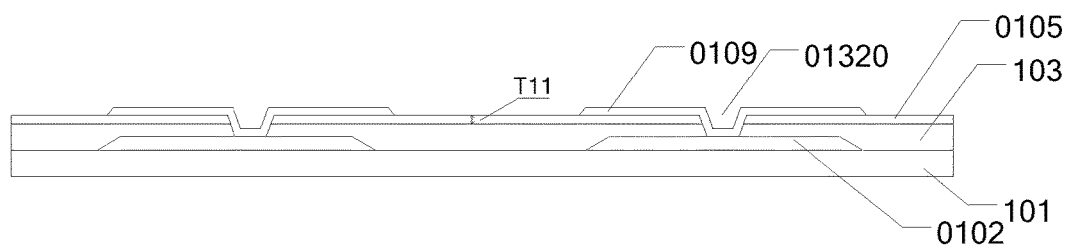
FIG. 11 is a schematic diagram of connection of a second conductive unit and a first conductive layer when a planarization layer with a second thickness is completely removed and a passivation layer (an insulation layer) is partially etched in an etching process of a peripheral/pad area according to an embodiment of the present disclosure.

Different from the first embodiment, in the manufacturing method of the display substrate provided in this embodiment, in step S4, as illustrated in FIG. 10, during the etching process in the peripheral area 01, the planarization layer 0108 with the second thickness is completely removed by thinning, and the passivation layer 105 (insulation layer 135) is partially thinned, and a via hole 01320 corresponding to the via hole 0131 is formed in the thinned passivation layer 0105 (with a thickness of T11, a remaining portion of the insulation layer after being thinned). As illustrated in FIG. 11, the second conductive unit 0109 is electrically connected with the first conductive unit 0102 through the via hole 01320. As illustrated in FIGS. 6 and 9A, a thickness of the insulation layer 105 before being thinned is T00. T11 is less than T00.

A cross-sectional view of the formed display substrate can be referred to FIG. 11.

Fourth Embodiment

Different from the first embodiment, in the manufacturing method of the display substrate provided in this embodiment, the first conductive unit 012 is formed between the gate insulation layer 103 and the passivation layer 105, and the second via hole 0132 passes through the thinned planarization layer 01081 and the passivation layer 105. A cross-sectional view of the formed display substrate can be referred to FIG. 12.

Fifth Embodiment

Different from the second embodiment, in the manufacturing method of the display substrate provided in this embodiment, the first conductive unit 012 is formed between the gate insulation layer 103 and the passivation layer 105, and the second via hole 0132 passes through the passivation layer 105.

Sixth Embodiment

Different from the third embodiment, in the manufacturing method of the display substrate provided in this embodiment, the first conductive unit 012 is formed between the gate insulation layer 103 and the passivation layer 105, and the second via hole 0132 passes through the thinned passivation layer (a passivation layer 0105 with the second thickness). A cross-sectional view of the formed display substrate can be referred to FIG. 13.

Seventh Embodiment

This embodiment provides a display substrate, as illustrated in FIGS. 1 and 9E, including:

a base substrate 101, the base substrate 101 including a display area 10 and a peripheral area 01, the peripheral area 01 including a pad area 011;

an insulation layer 135, disposed on the base substrate 101;

a planarization layer, disposed on the insulation layer 135. The planarization layer includes a display-area planarization layer disposed in the display area 10 and a peripheral-area planarization layer disposed in the peripheral area 01. A thickness of the peripheral-area planarization layer is less than that of the display-area planarization layer. A first via hole 0131 (referring to FIG. 9C) is provided in the peripheral-area planarization layer, and a second via hole 0132 corresponding to the first via hole 0131 is provided in the insulation layer 135 (referring to FIG. 9D).

In an example, as illustrated in FIG. 9E, the display substrate further includes a first conductive unit 0102 and a second conductive unit 0109 disposed in the peripheral area 01. The first conductive unit 0102 is disposed between the base substrate 101 and the insulation layer 135. The second conductive unit 0109 is disposed on the peripheral-area planarization layer, and the second conductive unit 0109 is electrically connected with the first conductive unit 0102 through the second via hole 0132. For example, the insulation layer 135 includes a gate insulation layer 103 and a passivation layer 105, and the gate insulation layer 103 is closer to the base substrate 101 than the passivation layer 105.

For example, the display substrate provided by this embodiment can be formed by any one of the methods of the first embodiment.

In another example, as illustrated in FIG. 12, the insulation layer 135 includes a passivation layer 105. The display substrate provided by this example can be formed using the method of the fourth embodiment.

For example, the display-area planarization layer in this embodiment corresponds to the planarization layer 108 with the first thickness in the display substrate manufacturing method described above, and the peripheral-area planarization layer corresponds to the thinned planarization layer 01081 in the display substrate manufacturing method.

Eighth Embodiment

The display substrate provided in this embodiment, as illustrated in FIG. 11, includes:

a base substrate 101, the base substrate 101 including a display area 10 and a peripheral area 01;

a gate insulation layer 103, disposed on the base substrate 101;

a passivation layer, disposed on the gate insulation layer 103, the passivation layer including a passivation layer 105 with a first thickness disposed in the display area 10 and a passivation layer 0105 with a second thickness disposed in the peripheral area 01. The second thickness is less than the first thickness, a via hole 01320 is provided in the gate insulation layer 103 and the passivation layer 0105 with the second thickness.

Figure 13:
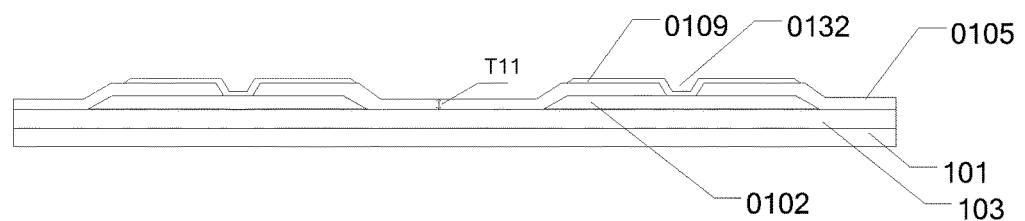
FIG. 13 is a schematic diagram of a second conductive unit connected with a first conductive unit through a second via hole when the first conductive unit is disposed between the gate insulation layer and the passivation layer according to an embodiment of the present disclosure.

In an example, as illustrated in FIG. 11, a first conductive unit 0102 and a second conductive unit 0109 disposed in the peripheral area 01 are further included. The first conductive unit 0102 is disposed between the base substrate 101 and the gate insulation layer 103. The second conductive unit 0109 is disposed on the passivation layer 0105 with the second thickness, the via hole 01320 passes through the passivation layer 0105 with the second thickness and the gate insulation layer 103, and the second conductive unit 0109 is electrically connected with the first conductive unit 0102 through the via hole 01320. The display substrate provided by this example can be formed using the method of the third embodiment. In an example, as illustrated in FIG. 13, the first conductive unit 0102 is disposed between the gate insulation layer 103 and the passivation layer 0105 with the second thickness, and the second conductive unit 0109 is disposed on the passivation layer 0105 with the second thickness. The via hole 01320 can be provided in the passivation layer 0105 with the second thickness. The display substrate provided by this example can be formed using the method of the sixth embodiment.

Ninth Embodiment

This embodiment provides a display device including any one of the display substrates as described in the above embodiments.

The COA array substrate of a liquid crystal display device with the TN mode has been described as an example, but it is not limited to the above description. The display substrate can also be used in liquid crystal display devices of other modes, and it is not limited to a liquid crystal display device. The display substrate can also be used in light emitting diode display devices, as long as the thickness of the planarization layer or insulation layer (e.g., passivation layer) in the pad area can be reduced, the first conductive unit and the second conductive unit can be connected with each other, thereby facilitating the connectivity between the second conductive unit and the driving circuit.

For example, in the embodiment of the present disclosure, the first conductive unit 0102 can be disposed in the same layer as the gate electrode, the source and drain electrodes, or the pixel electrode in the display area; and the second conductive unit 0109 can be formed in the same layer with a gate electrode, source and drain electrodes or a pixel electrode in the display area. When a common electrode is provided on the display substrate, one of the first conductive unit 0102 and the second conductive unit 0109 can be provided in the same layer as the common electrode.

It should be understood that, in the embodiments of the present disclosure, the "same layer" refers to forming a film layer configured to form a predetermined pattern by the same film forming process, and forming a layer structure with the same mask by one patterning process. According to differences of the predetermined pattern, the one patterning process can include multiple exposures, developments, or etching processes, and the predetermined pattern in the layer structure can be continuous and can be discontinuous, the predetermined pattern can also be in different heights or have different thicknesses.

The following statements should be noted:

(1) Unless otherwise defined, the same reference sign represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure can be enlarged. However, it should understood that, in the case in which a component or element such as a layer, film, area, substrate or the like is referred to be "on" or "under" another component or element, it can be directly on or under the another component or element or a component or element is interposed therebetween.

(4) In case of no conflict, features in one embodiment or in different embodiments can be combined.

What are described above is the embodiments of the disclosure only and not limitative to the scope of the disclosure; any of those skilled in related arts can easily conceive variations and substitutions in the technical scopes disclosed by the disclosure, which should be encompassed in protection scopes of the disclosure. Therefore, the scopes of the disclosure should be defined in the appended claims.

The invention claimed is:

1. A manufacturing method of a display substrate, comprising:
    forming an insulation layer on a base substrate, the base substrate comprising a display area and a peripheral area;
    forming a planarization film on the insulation layer;
    performing a patterning process to the planarization film to form a planarization layer with a first thickness in the display area, a planarization layer with a second thickness in the peripheral area, and a first via hole in the planarization layer with the second thickness, the second thickness being less than the first thickness;
    performing an etching process on the peripheral area to thin or remove the planarization layer with the second thickness, and forming a second via hole corresponding to the first via hole in the insulation layer,
    wherein the planarization layer with the second thickness is completely removed during thinning, and the insulation layer is partially removed in thickness, and the second via hole corresponding to the first via hole is formed in a remaining portion of the insulation layer.

2. The manufacturing method of the display substrate according to claim 1, wherein the second thickness of the planarization layer is less than or equal to a thickness of the insulation layer.

3. The manufacturing method of the display substrate according to claim 1, before forming the insulation layer on the base substrate, further comprising forming a first conductive unit in the peripheral area.

4. The manufacturing method of the display substrate according to claim 3, after forming the second via hole, further comprising forming a second conductive unit in the peripheral area, wherein the second conductive unit is electrically connected with the first conductive unit through the second via hole.

5. The manufacturing method of the display substrate according to claim 1, wherein the insulation layer comprises a passivation layer, or the insulation layer comprises a gate insulation layer and a passivation layer, the gate insulation layer is closer to the base substrate than the passivation layer.

6. The manufacturing method of the display substrate according to claim 1, wherein the patterning process comprises an exposing process and a developing process, and the planarization film is exposed with a multi-tone mask.

7. The manufacturing method of the display substrate according to claim 1, before forming the planarization film, further comprising forming a color filter layer in the display area.

* * * * *